US006882195B2

(12) United States Patent
Bui et al.

(10) Patent No.: US 6,882,195 B2
(45) Date of Patent: Apr. 19, 2005

(54) SIGNAL TIMING ADJUSTMENT CIRCUIT WITH EXTERNAL RESISTOR

(75) Inventors: Dinh Bui, San Jose, CA (US); Paul W. Self, Santa Clara, CA (US); Pedro W. Lo, Mountain View, CA (US); Satoshi Mukaida, San Jose, CA (US)

(73) Assignee: ICS Technologies, Inc., Wilmington, DE (US)

( * ) Notice: Subject to any disclaimer, the term of this patent is extended or adjusted under 35 U.S.C. 154(b) by 0 days.

(21) Appl. No.: 10/608,747

(22) Filed: Jun. 27, 2003

(65) Prior Publication Data

US 2004/0008065 A1 Jan. 15, 2004

Related U.S. Application Data

(60) Provisional application No. 60/395,584, filed on Jul. 12, 2002.

(51) Int. Cl.[7] .................................................. H03L 7/00
(52) U.S. Cl. ....................................... 327/161; 327/153
(58) Field of Search ................................ 327/144, 149, 327/152, 153, 156, 158, 161, 269, 270; 331/17, 25; 375/373, 375, 376

(56) References Cited

U.S. PATENT DOCUMENTS

| | | | | |
|---|---|---|---|---|
| 4,694,257 A | * | 9/1987 | Klein et al. ................ | 329/302 |
| 4,949,029 A | * | 8/1990 | Cooper et al. ............. | 324/74 |
| 4,987,373 A | | 1/1991 | Soo ............................ | 331/25 |
| 5,355,037 A | * | 10/1994 | Andresen et al. .......... | 327/158 |
| 5,446,867 A | | 8/1995 | Young et al. ............... | 331/17 |
| 5,754,071 A | * | 5/1998 | Suh ............................ | 327/279 |
| 5,859,550 A | | 1/1999 | Brandt ....................... | 327/156 |
| 5,949,261 A | | 9/1999 | Field et al. ................. | 327/156 |
| 6,043,717 A | | 3/2000 | Kurd .......................... | 331/17 |
| 6,177,844 B1 | | 1/2001 | Sung et al. ................. | 331/25 |
| 6,229,861 B1 | | 5/2001 | Young ........................ | 375/356 |
| 6,356,122 B1 | | 3/2002 | Sevalia et al. ............. | 327/105 |
| 6,411,665 B1 | | 6/2002 | Chan et al. ................ | 375/360 |
| 6,466,078 B1 | | 10/2002 | Stiff .......................... | 327/536 |

* cited by examiner

Primary Examiner—Linh My Nguyen
(74) Attorney, Agent, or Firm—Akin Gump Strauss Hauer & Feld, LLP

(57) ABSTRACT

A semiconductor device includes an external resistor for establishing a delay of a signal relative to another signal in the device. The resistor may be external to a buffer, such as a zero-delay buffer, that receives an input signal generates one or more output signals that relate to the input signal. The delay may be introduced either before or after the buffer.

14 Claims, 4 Drawing Sheets

SIGNAL TIMING ADJUSTMENT CIRCUIT WITH EXTERNAL RESISTOR

RELATED APPLICATIONS

This application claims priority to the co-pending U.S. provisional patent application No. 60/395,584, filed Jul. 12, 2002, entitled "PLL Based Zero Delay Buffer with an Input to Output Timing Relationship that is Adjustable with an External Resistor," which is incorporated herein by reference in its entirety.

FIELD OF THE INVENTION

This invention relates to a method and/or architecture for adjusting the timing of a clock signal and/or a data signal.

BACKGROUND OF THE INVENTION

In the design of computer boards, the timing relationship between data signals and the synchronizing clock signals is very critical. Significant skew between the timing of data signals and clock signals can result in errors such as loss of data, and it can also impair the performance of a system. Maintaining adequate timing margin between data signals and clock signals has become ever more difficult as clock signals have increased in frequency.

Prior attempts to calibrate clock and data signals have included complex circuitry that increases manufacturing costs and limits the computer board designer's ability to quickly and easily calibrate clock and data signal timing Other prior attempts to adjust timing relationships between clock signals and data signals include adjusting the length of printed circuit board (PCB) clock traces and adding capacitors and/or resistors to the PCB clock traces. A PCB trace is a path, typically comprised of copper, that carries a signal from one point to another on a PCB. Adjusting the length of a PCB clock trace allows the designer to increase or decrease the time that it will take a signal to travel from one end of the trace to the other end of the trace. This offers a solution that is both precise in timing and very repeatable. However, the method is also very inflexible. Once a clock trace is established on a PCB, the trace cannot be modified without re-design and re-manufacture of the computer board. Thus, adjusting computer board timing by adjusting the length of PCB clock traces can be very time consuming and expensive. Similarly, adding capacitors and/or resistors to the PCB clock traces tends to attenuate the clock signals and slow down the clock signals' transitions. These two effects result in more uncertainty in the clock timing which results in less timing margin.

If a means could be provided whereby the computer board designer could easily adjust the timing relationship between the clock signals and data signals, this would make the development of computer boards easier and faster. This would also improve the performance of the computer board.

SUMMARY OF THE INVENTION

The present invention provides a means for adjusting the timing relationship between the clock and data signals on a circuit board using a zero delay buffer and an external resistor. In accordance with a preferred embodiment, a semiconductor device has an external resistor for establishing a delay of a signal relative to another signal of the circuit.

In accordance with an alternate embodiment, a semiconductor device includes a buffer, preferably a zero-delay buffer, that receives an input signal and generates a plurality of output signals that relate to the input signal. The zero-delay buffer includes a delay generator. A resistor has a first resistor end and is electrically connected to the delay generator and a second resistor end that is electrically connected to ground. The resistor is external to the zero-delay buffer. The device may be implemented on a circuit board and the external resistor is removably connected to a pin on the device package. The device may also include a plurality of internal capacitors which are used in conjunction with an external resistor for providing a timing reference, such that each capacitor has a first capacitor end that is electrically connected to a current source and a second capacitor end that is electrically connected to ground or a voltage reference. The buffer preferably includes a phase locked loop that has a phase detector, and the delay generator, a delay line and the external resistor are electrically connected to adjust the timing of a signal before the signal reaches the phase detector.

In accordance with an alternate embodiment, a method of adjusting the timing of an output signal of a semiconductor device includes the steps of electrically connecting a first terminal of an external resistor to a buffer, such as a zero-delay buffer, that generates a plurality of output signals, and electrically connecting a second terminal of the external resistor to a ground or a voltage reference. The zero-delay buffer includes a delay generator and a phase locked loop, and the first terminal of the external resistor is electrically connected to delay generator to adjust the timing of one or more of the output signals in an amount that is dependent upon the value of the external resistor.

In accordance with an alternate embodiment, a semiconductor device includes an input terminal for receiving an input signal, a buffer, such as a zero-delay buffer, for generating a plurality of output signals, and an external resistor for altering a timing of one or more, or all, of the plurality of output signals relative to a timing of the input signal.

There have thus been outlined the more important features of the invention in order that the detailed description thereof that follows may be better understood, and in order that the present contribution to the art may be better appreciated. There are, of course, additional features of the invention that will be described below and which will form at least part of the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein, as well as the abstract included below, are for the purpose of description and should not be regarded as limiting in any way.

As such, those skilled in the art will appreciate that the concept and objectives, upon which this disclosure is based, may be readily utilized as a basis for the design of other structures, methods and systems for carrying out the several purposes of the present invention. It is important, therefore, that the claims be regarded as including such equivalent constructions insofar as they do not depart from the spirit and scope of the present invention.

DETAILED DESCRIPTION OF PREFERRED EMBODIMENTS

The present invention uses a semiconductor device such as that known as a zero-delay buffer (ZDB) to allow a computer board designer to adjust the phase (or timing) relationship between the input clock and the output clocks of the ZDB with an external resistor. The board designer then can optimize the timing relationship between the synchronizing clock signals and the data signals to achieve maximum timing margin and optimal performance.

The use of a ZDB to create clock signals on a computer board is commonly known. A ZDB is a timing device that duplicates a synchronizing clock signal. The output of an ideal ZDB is a clock signal or set of clock signals that have the exact same frequency and the exact same phase as its input clock signal. An exemplary ZDB structure may be found in, for example, U.S. Pat. No. 6,229,861, to Young, of which FIGS. 3 and 4 and the accompanying text are incorporated herein by reference, as well as U.S. Pat. No. 6,466,078, to Stiff, and U.S. Pat. No. 5,859,550, to Young.

Figure 1A:
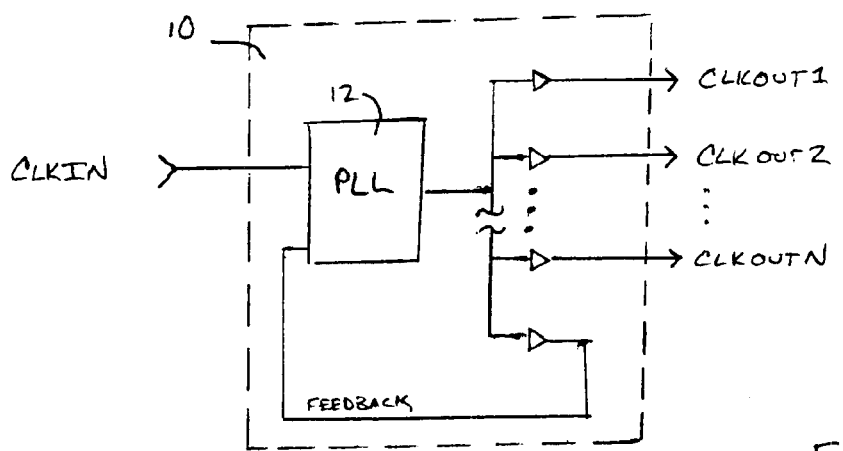
FIGS. 1A and 1B illustrate an exemplary zero-delay buffer and the typical relationship between input and output signals from such a device.
Figure 1B:
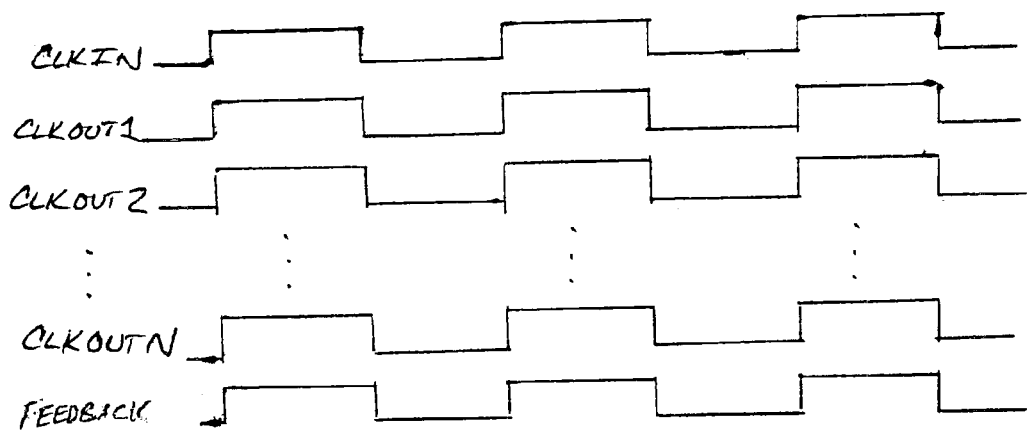

In the present invention, a buffer, and preferably a phase locked loop-based buffer such as a ZDB, is used in combination with an external resistor to allow adjustment and optimization of the clock signal timing relative to the data signals. Normally, a ZDB produces copies of an input clock that are of the same frequency and substantially, and preferably exactly, in phase with the input clock. FIGS. 1A and 1B illustrate the operation of exemplary ZDB 10. As shown in FIG. 1A, ZDB 10 includes a phase locked loop (PLL) 12 and produces a number of output signals CLKOUT1 through CLKOUTN in response to an input signal CLKIN. Exemplary PLL circuits are disclosed in FIGS. 1 and 2 and the accompanying text in U.S. Pat. No. 6,356,122 to Sevalia, as well as in FIG. 1 and the accompanying text in U.S. Pat. No. 5,446,867 to Young, et al. The preferred PLL structure is that commonly known to those skilled in the art as a "type 2 PLL" or "integrator and lead PLL", another PLL circuit that produces the desired result may be used. As shown in FIG. 1B, the output signals CLKOUT1 through CLKOUTN of the exemplary ZDB exhibit the same phase and frequency as input signal CLKIN.

Figure 2A:
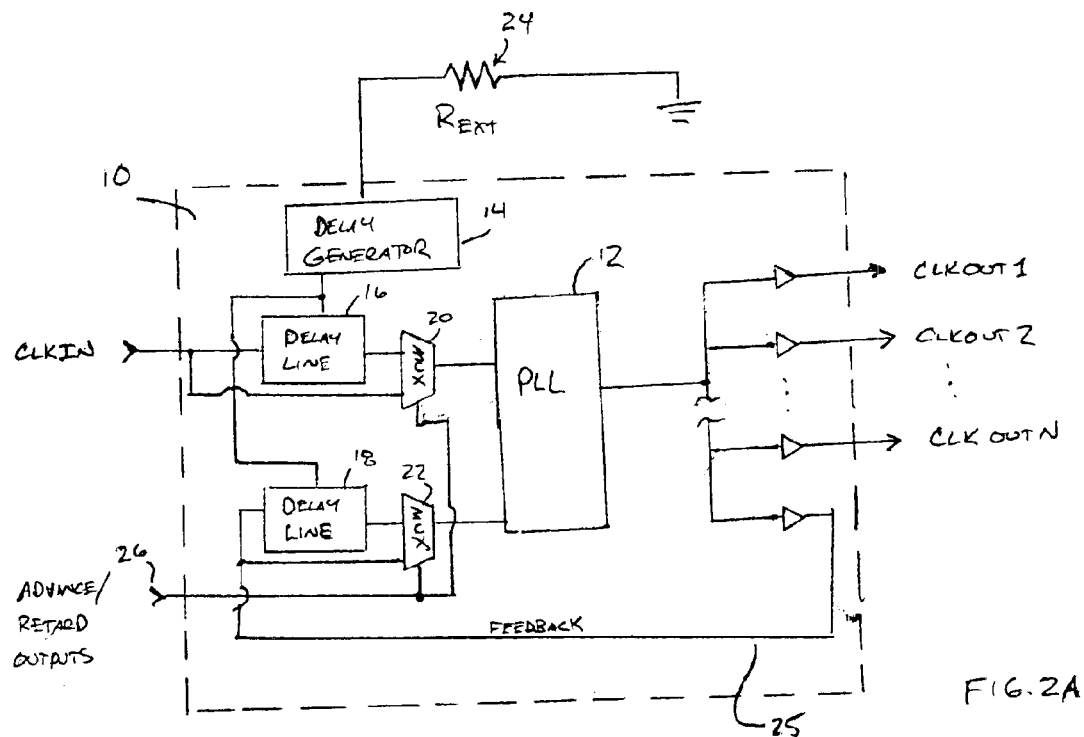
FIGS. 2A and 2B illustrate a preferred embodiment of the invention, and exemplary signals, in which the zero-delay buffer is connected to an external resistor that enables a time shift between the input signal and output signals of the zero-delay buffer.
Figure 2B:
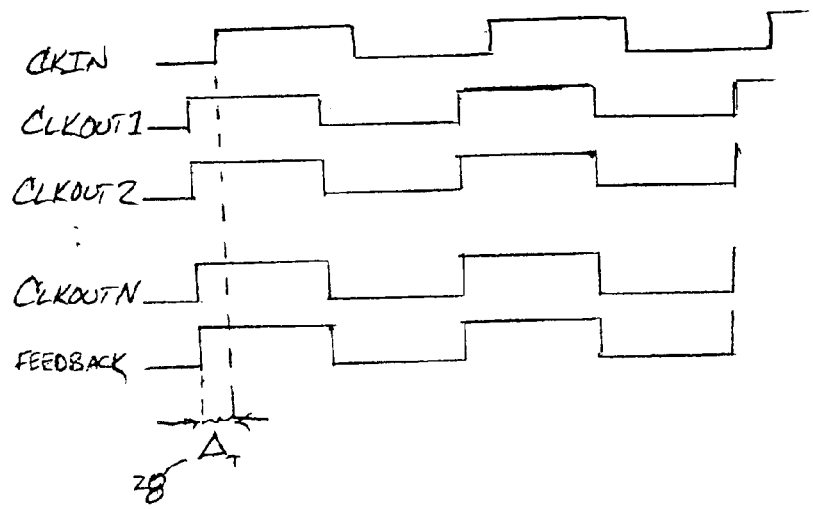

In a preferred embodiment of the present invention, a computer board designer can adjust the phase (timing) relationship between the input clock signal CLKIN or feedback signal 25 and the output clock signals of the ZDB by adjusting the value of an external resistor. The computer board designer can then optimize the timing relationships between the system clock or feedback signals and data signals by adjusting the value of this external resistor. A preferred embodiment of this feature is illustrated in FIGS. 2A and 2B. Referring to FIG. 2A, the ZDB 10 still includes PLL 12, and it also includes delay generator 14 and delay lines 16 and 18. PLL 12 preferably includes a phase detector and other elements typical of a type 2 PLL or integrator and lead PLL. External resistor $R_{EXT}$ 24 is included in the circuitry between delay generator 14 and ground or a voltage reference. Optionally and alternatively, in the present invention the resistor may be included in or integral with the ZDB and connected to ground or the voltage reference via an external link, although an external resistor is preferred since it may be more easily removed and exchanged, such as when connected to the ZDB via a pin on the integrated circuit or device package.

The preferred operation of the additional elements shown in FIG. 2A will be discussed below in the text that refers to FIG. 3. As shown in FIG. 2B, this structure yields output signals CLKOUT1 through CLKOUTN that are equal to CLKIN in frequency and magnitude, but which are different from CLKIN in phase in an amount $\Delta_T$ 28 that is dependent upon the value of external resistor $R_{EXT}$ 24. The output signals are advanced or retarded in phase relative to CLKIN based on the setting of an Advance/Retard Outputs pin 26 on the PCB.

Figure 3:
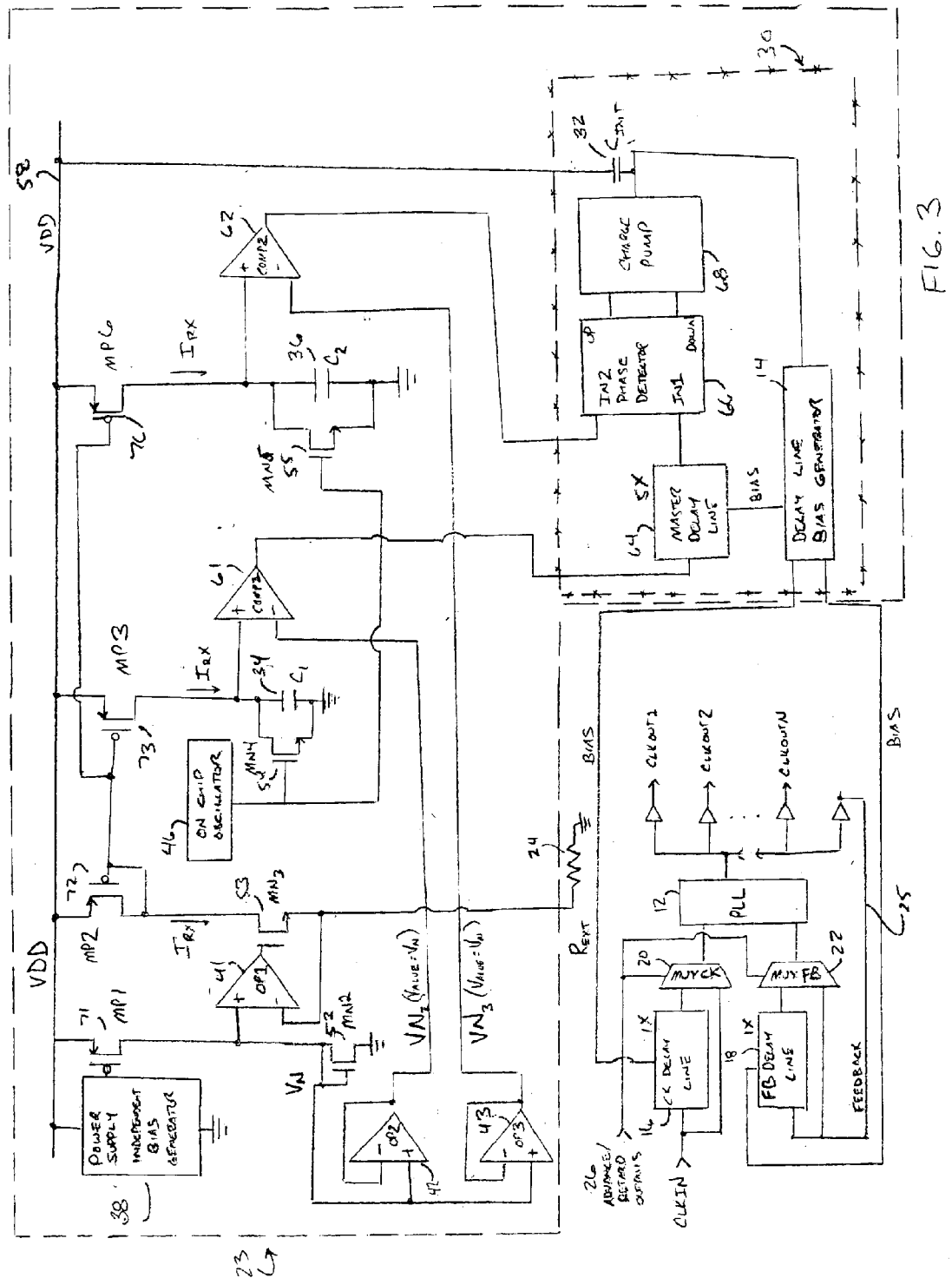
FIG. 3 provides additional detail of the elements of the zero-delay buffer of FIG. 2A.

A preferred embodiment of a ZDB circuit that can perform the input clock signal to output clock signals timing adjustment with an external resistor of adjustable value is illustrated in FIG. 3. This circuit has the ability to create delay lines which have delays that are only dependent on the value of an external resistor 24 and the value of internal capacitors 34 and 36 of the integrated circuit. The delay lines 16 and 18 are used with the ZDB's PLL 12 to adjust the timing relationship between the clock input signal and clock output signals.

The preferred operation of the circuit illustrated in FIG. 3 is as follows. The external resistor 24, $R_{EXT}$, is external to Delay Generator 23 and is used to create a current, $I_{RX}$, having a value that is substantially equal in value to $V_N/R_{Ext}$. The current $I_{RX}$ is generated by using operational amplifier (op amp) OP1 41 and n-channel device MN3 53 to force a voltage substantially equal in value to $V_N$ across resistor $R_{EXT}$ 24. The voltage, $V_N$, is generated by sourcing current from P-channel device MP1 71 into the diode-connected N-channel device MN2 52. The gate bias voltage for MP1 71 is preferably generated by a Power Supply Independent Bias Cell 38. The current, $I_{RX}$, flows through transistor MN3 53 and P-channel bias device MP2 72.

The gates of P-channel transistors MP3 73 and MP6 76 are connected to the drain and gate of MP2 72. Because of this, devices MP3 73 and MP6 76 have substantially the same value of current flowing in them as MP2 72. In other possible configurations, and in fact in the preferred embodiment, devices MP3 73 and MP6 76 could be cascoded with other p-channel transistors in series. The current $I_{RX}$ is used to charge timing capacitors $C_1$ 34 and $C_2$ 36. In a preferred embodiment, the value of capacitor $C_2$ 36 is 1.2 times the value of $C_1$ 34. However other ratios having a value greater than one (such as 1.1 to 1) may be used. N-channel devices MN4 54 and MN5 55 are used to periodically discharge capacitors $C_1$ 34 and $C_2$ 36. The periodicity of this discharge is set by the frequency of an on chip oscillator 46 or other appropriate functional element.

After capacitors $C_1$ 34 and $C_2$ 36 have been discharged and the gates of MN4 54 and MN5 55 are forced substantially to zero volts to turn them off, capacitors $C_1$ 34 and $C_2$ 36 begin charging with a charging current value of $I_{RX}$. Comparators COMP1 61 and COMP2 62 are used to determine when the capacitors have charged up to a value of $V_N$, or the voltage across MN2 52. As shown in FIG. 3, the threshold voltage for comparators COMP1 61 and COMP2 63 preferably comes from op amps OP2 42 and OP3 43. OP2

42 and OP3 43 provide two voltage sources with a value substantially equal to $V_N$. The time required to charge up to $V_N$ is longer for capacitor $C_2$ 36 than capacitor $C_1$ 34 even though the charging current for both is the same. The charging time is longer because $C_2$ 36 is has a larger value than $C_1$ 34. Preferably, $C_2$ 36 is 1.2 times larger than $C_1$ 34. A preferred equation set that derives the charging time difference, $t_{C2}-t_{C1}$, is $$t_{c1} = V_N \frac{C_1}{I_{RX}}; I_{RX} = \frac{V_N}{R_{EXT}}.$$

$$t_{c1} = V_N \frac{C_1}{\frac{V_N}{R_{EXT}}}.$$

$$t_{c1} = R_{EXT} C_1$$

$$t_{c2} = V_N \frac{C_2}{I_{RX}}; \quad C_2 = 1.2 \ C_1;$$

$$I_{RX} = \frac{V_N}{R_{EXT}}. \quad t_{c2} = V_N \frac{1.2 C_1}{\frac{V_N}{R_{EXT}}}$$

$$t_{c2} = 1.2 \ R_{EXT} C_1$$

$$t_{c2}-t_{c1} = 1.2 \ R_{EXT} C_1 - R_{EXT} C_1$$

$$t_{c2}-t_{c1} = 0.2 \ R_{EXT \ C1}$$

Examination of the above equation set shows that, in the preferred embodiment, the charging time difference is only dependent on the value of $R_{EXT}$ 24 and the values of capacitors $C_1$ 34 and $C_2$ 36. When the voltage on each capacitor, $C_1$ 34 and $C_2$ 36, exceeds $V_N$, the outputs of each comparator, COMP1 61 and COMP2 62, transition from a low voltage to a high voltage. The difference in time between the output transitions of COMP1 61 and COMP2 62 is equal to the charging time difference of $C_1$ 34 and $C_2$ 36.

The output transitions of COMP1 61 and COMP2 62 are fed into a Delay Lock Loop (DLL) block 30. The DLL forces a Master Delay Line 64 to have a delay equal in value to the time difference between the output transitions of COMP1 61 and COMP2 62. This delay value is also equal to $t_{c1}-t_{c2}$ which is the charging time difference of $C_1$ 34 and $C_2$ 36. The Master Delay Line 64 therefore has a delay value of 0.2 $R_{EXT} C_1$.

Two delay lines that are scaled versions of the Master Delay Line 64 may be placed in series with the PLL inputs. These two delay lines, CK Delay Line 16 and FB Delay Line 18, are preferably scaled to have delay values that are approximately 0.2 times the delay value of the Master Delay Line 62. Thus, the net result is that the delay values for the CK Delay Line 16 and the FB Delay Line 18 are equal to 0.04 $R_{EXT} C_1$.

The control of the timing relationship between the PLL clock outputs and the clock input is done in the following manner. First, the selection of whether to advance or retard the clock outputs relative to the clock input is made by forcing the 'ADVANCE/RETARD' input 26 to the corresponding logic level. If ADVANCE is selected, multiplexer MUXFB 22 passes a signal from the FB Delay Line 18, and the multiplexer MUXCK 20 passes a signal that comes directly from the CLKIN input. This creates a extra delay in the feedback path of the PLL 12. Preferably, the value of this delay is equal to 0.04 $R_{EXT} C_1$. Accordingly, the user of this circuit can adjust the amount of delay between the clock input and the clock outputs by adjusting the value of $R_{EXT}$ 24. Because of this extra delay that is in the feedback path, the PLL forces the clock outputs to be advanced in phase relative to the clock input. The PLL advances the clock outputs until the inputs to the PLL are aligned in phase.

If RETARD is selected at the ADVANCE/RETARD input 26, extra delay is put into the clock input path. Extra delay in the clock input path results from multiplexer MUXCK 20 passing a signal from the CK Delay Line 16 and multiplexer MUXFB 22 passing a signal directly from the feedback line. The extra delay in the clock input path results in the clock outputs being retarded in phase relative to the clock input.

The DLL 30 works in the following manner. The inputs to the DLL phase detector 66 originate from the outputs of COMP1 61 and COMP2 62. The output signal of COMP2 62 feeds directly into phase detector 66 and the output signal of COMP1 61 first passes through the Master Delay Line 64 before going to the input of phase detector 66. The DLL 30 forces the rising edges of the phase detector 66 inputs to be aligned in phase. The DLL does this by adjusting the delay value of the Master Delay Line 64 until the phase detector 66 inputs are aligned. If the rising edges of the phase detector 66 inputs are not in phase alignment, the appropriate error correction signal is generated at either the 'UP' output or 'DOWN' output of phase detector 66. The UP or DOWN signal then drives the Charge Pump 68 to charge or discharge the capacitor $C_{INT}$ 32 with the appropriate amount of electrical charge. The voltage on the capacitor $C_{INT}$ 32 then drives the Delay Line Bias Generator 14. The Delay Line Bias Generator 14 develops a signal that may be called "Bias," which may be used to control the amount of delay in the Master Delay Line 64.

The Delay Line Bias Generator 14 creates a bias voltage or bias current that is fed into the Master Delay Line 64. Two other bias lines from the Delay Line Bias Generator 14 are fed into the CK Delay Line 16 and the FB Delay Line 18. The bias voltage or bias current controls the amount of delay in the Master Delay Line 64, the CK Delay Line 16, and the FB Delay Line 18. At an update rate that is equal to the frequency of the On-Chip Oscillator 46, the DLL 30 periodically checks the phase relationship at the inputs to the phase detector 66 and produces a correction signal to drive the delay of the Master Delay Line 64 in the direction to force the two phase detector 66 inputs to be in phase. Eventually the DLL 30 will force the Master Delay Line 64 to a delay value, and preferably a delay value of 0.2 $R_{EXT} \cdot C_1$. This also results in the delay value of CK Delay Line 16 and FB Delay Line 18 being equal to 0.04 $R_{EXT} \cdot C_1$.

Figure 4A:
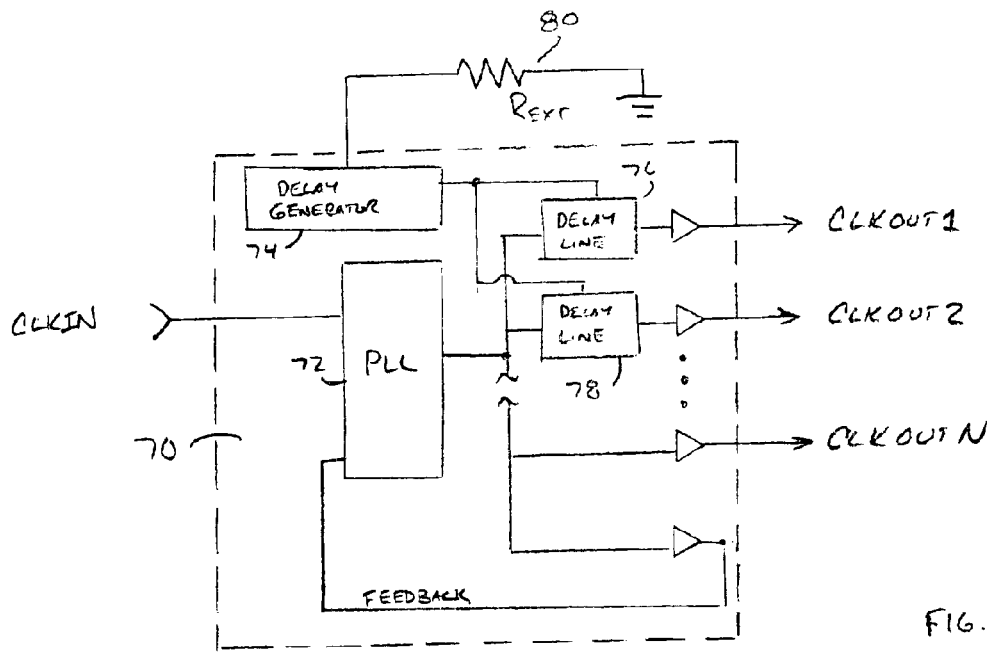
FIGS. 4A and 4B illustrate an embodiment of the invention, and exemplary signals, in which the zero delay buffer includes an external resistor that enables a time shift between the various output signals of the zero-delay buffer.
Figure 4B:
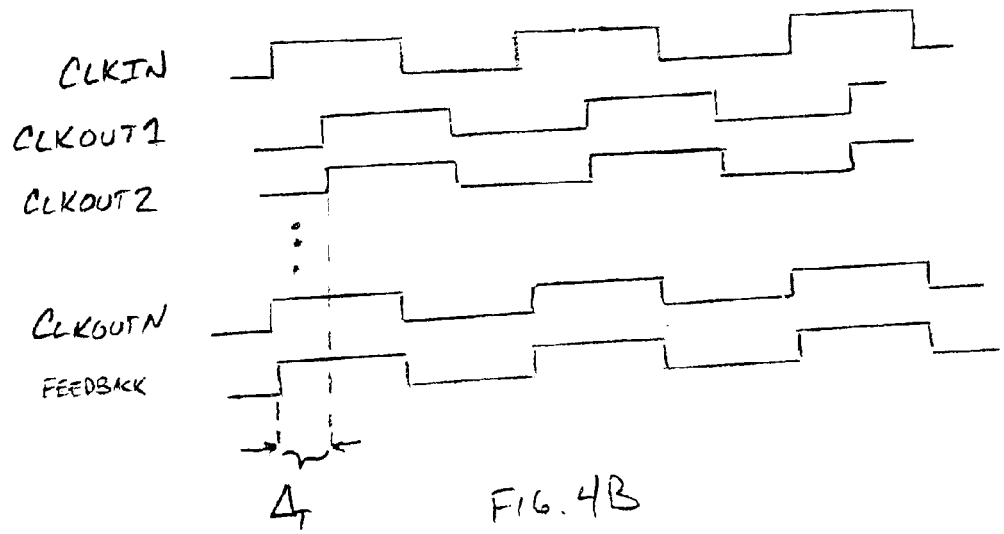

In an alternate embodiment, an external resistor can also be used to adjust the timing relationship between one clock output of the ZDB and another clock output of the ZDB. A preferred structure for such a relationship is illustrated in FIG. 4A. As with the previously-illustrated embodiment, this embodiment includes a ZDB 70 having a PLL 72 and delay generator 74. An external resistor 80 is positioned between delay generator 74 and ground or a voltage reference. Instead of connecting delay lines on the input side of PLL 72, delay lines 76 and 78 are located on the output of PLL 72 to provide a timing shift for each output signal CLKOUT for which an adjustment is desired. As illustrated in FIG. 4B, the timing difference $\Delta_T$ between the CLKIN signal and signals CLKOUT1 and CLKOUT2 is dependent upon the value of external resistor $R_{EXT}$ 80. Because no delay lines are connected in series with output signal CLKOUTN in the example illustrated in FIG. 4, there is not a timing difference between CLKIN and CLKOUTN.

The same circuitry that was illustrated in FIG. 3 and previously described can be used to create the delay lines and adjust the delay value of the delay lines in FIG. 4.

The many features and advantages of the invention are apparent from the detailed specification. Thus, the invention is intended to include all such features and advantages of the invention which fall within the true spirits and scope of the invention. Further, since numerous modifications and variations will readily occur to those skilled in the art, it is not desired to limit the invention to the exact construction and operation illustrated and described in the specification, claims, and drawings herein. Accordingly, all appropriate modifications and equivalents may be included within the scope of the invention.

The invention claimed is:

1. A semiconductor device comprising:
    an integrated circuit buffer having a delay generator, the buffer receiving a clock input signal and generating a plurality of output signals that are copies of the clock input signal delayed or advanced in time relative to the clock input signal, the delay generator being configured to phase-shift the timing of the plurality of output signals with respect to the clock input signal; and
    a resistor having a resistance value, a first resistor end that is electrically connected to the delay generator and a second resistor end that is electrically connected to ground or a voltage reference, the resistor being external to the integrated circuit buffer, the resistance value determining a magnitude of the phase-shift caused by the delay generator.

2. The device of claim 1 wherein the buffer comprises a zero-delay buffer.

3. The device of claim 1 wherein the device is implemented on a circuit board and the external resistor is connected to a pin on a device package.

4. A semiconductor device comprising:
    an integrated circuit buffer having a delay generator, the buffer receiving an input signal and generating a plurality of output signals that relate to the input signal;
    a resistor having a first resistor end that is electrically connected to the delay generator and a second resistor end that is electrically connected to ground or a voltage reference, the resistor being external to the integrated circuit buffer; and
    a plurality of internal capacitors which are used in conjunction with the external resistor to provide a timing reference, each capacitor having a first capacitor end that is electrically connected to a current source and a second capacitor end that is electrically connected to ground or a voltage reference.

5. The device of claim 1 wherein:
    the buffer further includes a phase locked loop, the phase locked loop including a phase detector; and
    the delay generator, a delay line and the external resistor are electrically connected to adjust the timing of an internal feedback signal before the feedback signal reaches the phase detector.

6. The device of claim 5 wherein the plurality of output signals are phase-shifted to have a timing that is advanced relative to the input signal.

7. The device of claim 1 wherein:
    the buffer further includes a phase locked loop, the phase locked loop including a phase detector; and
    the delay generator, a delay line and the external resistor are electrically connected to adjust the timing of the clock input signal before the clock input signal reaches the phase detector.

8. The device of claim 7 wherein the plurality of output signals are phase-shifted to have a timing that is retarded relative to the clock input signal.

9. The device of claim 1 wherein:
    the buffer includes a phase locked loop; and
    the delay generator, a delay line and the external resistor are electrically connected to adjust the timing of one or more of the output signals exiting the phase locked loop to yield adjusted output signals.

10. A method of adjusting the timing of an output signal of a semiconductor device, comprising:
    electrically connecting a first terminal of an external resistor to a buffer that generates a plurality of output signals, the external resistor having a resistance value and the buffer including a delay generator and a phase locked loop, the first terminal of the external resistor being electrically coupled to the delay generator;
    electrically connecting a second terminal of the external resistor to a ground or a voltage reference;
    receiving a clock input signal in the buffer;
    generating output signals from the buffer that are copies of the clock input signal delayed or advanced in time relative to the clock input signal; and
    phase-shifting the timing of one or more of the output signals with respect to the clock input signal in an amount that is dependent upon the resistance value of the external resistor.

11. The method of claim 10 wherein the buffer comprises a zero-delay buffer.

12. A semiconductor device comprising:
    an input terminal that receives a clock input signal;
    a buffer that receives the input signal from the input terminal which is configured to generate a plurality of output signals that are copies of the clock input signal delayed or advanced in time relative to the clock input signal and to phase-shift the timing of at least one of the plurality of output signals with respect to the clock input signal; and
    an external resistor coupled between the buffer and ground or a voltage reference, the external resistor having a resistance value that determines a magnitude of the phase-shift of at least one of the plurality of output signals relative to the clock input signal.

13. The device of claim 12 wherein the buffer comprises a zero-delay buffer.

14. The device of claim 13 wherein the device is implemented on a circuit board and the external resistor is connected to a pin on a package of the device.

* * * * *